(12) United States Patent  (10) Patent No.: US 8,250,437 B2
Sakurada et al.  (45) Date of Patent: Aug. 21, 2012

(54) MEMORY SYSTEM AND CONTROL METHOD FOR THE SAME

(75) Inventors: Kenji Sakurada, Kanagawa (JP); Hironori Uchikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 243 days.

(21) Appl. No.: 12/796,211

(22) Filed: Jun. 8, 2010

(65) Prior Publication Data

US 2011/0083060 A1 Apr. 7, 2011

(30) Foreign Application Priority Data

Oct. 5, 2009 (JP) ................................. 2009-231832

(51) Int. Cl.
*G11C 29/00* (2006.01)
(52) U.S. Cl. ........................................ 714/764; 714/780
(58) Field of Classification Search .................. 714/773, 714/780, 758, 752, 764
See application file for complete search history.

(56) References Cited

U.S. PATENT DOCUMENTS

| | | | |
|---|---|---|---|
| 7,137,060 B2 | 11/2006 | Yu et al. | |
| 7,369,615 B2 | 5/2008 | Han et al. | |
| 7,454,685 B2 | 11/2008 | Kim et al. | |
| 7,966,546 B2* | 6/2011 | Mokhlesi et al. | 714/773 |
| 8,051,363 B1* | 11/2011 | Liu | 714/780 |
| 8,103,935 B2* | 1/2012 | Matsumoto et al. | 714/758 |
| 8,156,400 B1* | 4/2012 | Yeo et al. | 714/758 |
| 2008/0104459 A1 | 5/2008 | Uchikawa et al. | |
| 2008/0148128 A1* | 6/2008 | Sharon et al. | 714/758 |
| 2008/0294960 A1* | 11/2008 | Sharon et al. | 714/752 |

OTHER PUBLICATIONS

U.S. Appl. No. 12/715,772, filed Mar. 2, 2010, Hironori Uchikawa, et al.
U.S. Appl. No. 12/622,868, filed Nov. 20, 2009, Kenji Sakurada.

* cited by examiner

*Primary Examiner* — David Ton
(74) *Attorney, Agent, or Firm* — Oblon, Spivak, McClelland, Maier & Neustadt, L.L.P.

(57) ABSTRACT

A memory system in an embodiment having a host and a memory card, including: a plurality of semiconductor memory cells, each cell being configured to store N-bit coded data based on threshold voltage distributions; an LLR table storage section configured to store a first LLR table that consists of normal LLR data corresponding to predetermined threshold voltages and a second LLR table that consists of LLR data such that two LLRs at each location corresponding to each location in the first LLR table at which a sign is inverted between two adjacent LLRs are "0"; and a decoder configured to perform decoding processing through probability-based repeated calculations using an LLR.

19 Claims, 11 Drawing Sheets

| Higher | 1 | | | 0 | | | 0 | | | 1 | | | 1 | | | 0 | | | 0 | | | 1 | | |
|---|---|---|---|---|---|---|---|---|---|---|---|---|---|---|---|---|---|---|---|---|---|---|---|---|
| Upper | 1 | | | 1 | | | 0 | | | 0 | | | 0 | | | 0 | | | 1 | | | 1 | | |
| Lower | 1 | | | 1 | | | 1 | | | 0 | | | 0 | | | 0 | | | 0 | | | 0 | | |
| LLR (H) | -11 | -9 | -8 | 5 | 9 | 10 | 11 | 12 | 10 | 8 | 6 | -5 | -9 | -11 | -12 | -11 | -8 | -5 | 5 | 9 | 10 | 11 | 12 | 11 | 9 | 6 | -6 | -9 | -11 | -14 |
| LLR (U) | -15 | -15 | -14 | -13 | -12 | -9 | -8 | -5 | 5 | 10 | 11 | 12 | 13 | 16 | 17 | 15 | 11 | 10 | 11 | 10 | 9 | -5 | -9 | -12 | -13 | -15 | -16 | -17 |
| LLR (L) | -22 | -20 | -19 | -19 | -18 | -17 | -16 | -16 | -15 | -15 | -14 | -13 | -12 | -9 | 6 | 9 | 10 | 11 | 12 | 13 | 14 | 15 | 16 | 18 | 19 | 21 | 22 | 22 | x: Threshold Voltage →

22

| Higher | 1 | | | 0 | | | 0 | | | 1 | | | 1 | | | 0 | | | 0 | | | 1 | | |
|---|---|---|---|---|---|---|---|---|---|---|---|---|---|---|---|---|---|---|---|---|---|---|---|---|
| Upper | 1 | | | 1 | | | 0 | | | 0 | | | 0 | | | 0 | | | 1 | | | 1 | | |
| Lower | 1 | | | 1 | | | 1 | | | 0 | | | 0 | | | 0 | | | 0 | | | 0 | | |
| LLR (H) | -11 | -9 | -8 | 0 | 9 | 10 | 11 | 12 | 10 | 8 | 0 | 0 | -9 | -11 | -12 | -11 | -8 | 0 | 0 | 9 | 10 | 11 | 12 | 11 | 9 | 0 | 0 | -9 | -11 | -14 |
| LLR (U) | -15 | -15 | -14 | -13 | -12 | -9 | -8 | 0 | 0 | 10 | 11 | 12 | 13 | 16 | 17 | 15 | 11 | 10 | 11 | 10 | 9 | 0 | 0 | -12 | -13 | -15 | -16 | -17 |
| LLR (L) | -22 | -20 | -19 | -19 | -18 | -17 | -16 | -16 | -15 | -15 | -14 | -13 | -12 | -9 | 0 | 9 | 10 | 11 | 12 | 13 | 14 | 15 | 16 | 18 | 19 | 21 | 22 | 22 | x: Threshold Voltage →

Table 20B (21B):

| Higher | 1 | | 0 | | 0 | | 1 | | 0 | | 0 | | 1 |
|---|---|---|---|---|---|---|---|---|---|---|---|---|---|
| Upper | 1 | | 1 | | 0 | | 0 | | 0 | | 1 | | 1 |
| Lower | 1 | | 1 | | 1 | | 0 | | 0 | | 0 | | 0 |
| LLR (H) | -11 | -9 | -8 | 9 | 10 | 12 | 8 | 6 | -5 | -9 | -8 | 15 | 11 | 9 | 10 | 11 | 12 | 9 | 11 | -9 | -11 | -14 |
| LLR (U) | -15 | -15 | -6 | 5 | -8 | 5 | 10 | 11 | 12 | 13 | 16 | 17 | 5 | 10 | 9 | 6 | -5 | 16 | -13 | -15 | -16 | -17 |
| LLR (L) | -22 | -20 | -19 | -19 | -18 | -17 | -16 | -15 | -14 | -13 | -12 | -9 | -8 | 6 | 14 | 15 | 18 | 19 | 21 | 22 | 22 |

Table 22B:

| Higher | 1 | | 0 | | 0 | | 1 | | 0 | | 0 | | 1 |
|---|---|---|---|---|---|---|---|---|---|---|---|---|---|
| Upper | 1 | | 1 | | 0 | | 0 | | 0 | | 1 | | 1 |
| Lower | 1 | | 1 | | 1 | | 0 | | 0 | | 0 | | 0 |
| LLR (H) | -11 | -9 | -8 | 9 | 10 | 12 | 8 | 7 | -1 | -9 | -8 | 15 | 11 | 9 | 10 | 11 | 12 | 9 | 7 | -1 | -9 | -11 | -14 |
| LLR (U) | -15 | -15 | 1 | -7 | -8 | 1 | 10 | 11 | 12 | 13 | 16 | 17 | -7 | 10 | 9 | 7 | -1 | 16 | -13 | -15 | -16 | -17 |
| LLR (L) | -22 | -20 | -19 | -19 | -18 | -17 | -16 | -15 | -14 | -13 | -12 | -9 | -8 | 1 | 14 | 15 | 18 | 19 | 21 | 22 | 22 | x: Threshold Voltage →

FIG.11

MEMORY SYSTEM AND CONTROL METHOD FOR THE SAME

CROSS-REFERENCE TO RELATED APPLICATION(S)

This application is based upon and claims the benefit of priority from Japanese Patent Application No. 2009-231832 filed on Oct. 5, 2009; the entire contents of which are incorporated herein by reference.

BACKGROUND

1. Field

Embodiments described herein relate generally to a memory system and a control method for the same configured to perform encoding processing on data and store the data as coded data and to perform decoding processing on coded data when reading the coded data, and more particularly, to a memory system and a control method for the same configured to use LLR tables to perform decoding processing through probability-based repeated calculations.

2. Description of the Related Art

In memory systems that include a host and a storage apparatus having a semiconductor memory section, data encoding processing and decoding processing are performed with error correcting codes.

Error correcting codes can be roughly divided into algebra-based hard decision decoding codes such as BCH codes or RS codes, and soft decision decoding codes using probability-based repeated calculations. Low density parity check codes (hereinafter referred to as "LDPC codes") belonging to soft decision decoding codes are becoming a focus of attention. For LDPC codes, excellent performance approaching a Shannon limit, which is a theoretical limit of code performance, has been reported.

Here, in storage apparatuses having a NAND-type semiconductor memory section, storage of data of a plurality of bits in one memory cell or what is called multivalue memory greatly contributes to increasing the storage density. In the multivalue memory, data is read when a threshold voltage corresponding to the amount of charge injected into a charge storage layer of each memory cell is applied to a word line.

BRIEF DESCRIPTION OF THE DRAWINGS

FIGS. 5A and 5B are diagrams for describing changes of LLRs due to a change of the threshold voltage distributions, where FIG. 5A shows a case where the threshold voltage distributions and the LLR table are aligned, and FIG. 5B shows a case where the threshold voltage distributions and the LLR table are misaligned due to a shift of the threshold voltage distributions to a low-voltage side;

FIGS. 9A and 9B are diagrams for describing changes of LLRs due to a shift of the threshold voltage distributions, where FIG. 9A shows a case where the threshold voltage distributions and the LLR table are aligned, and FIG. 9B shows a case where the threshold voltage distributions and the LLR table are misaligned due to a shift of the threshold voltage distributions to the high-voltage side;

DETAILED DESCRIPTION

First Embodiment

Figure 1:
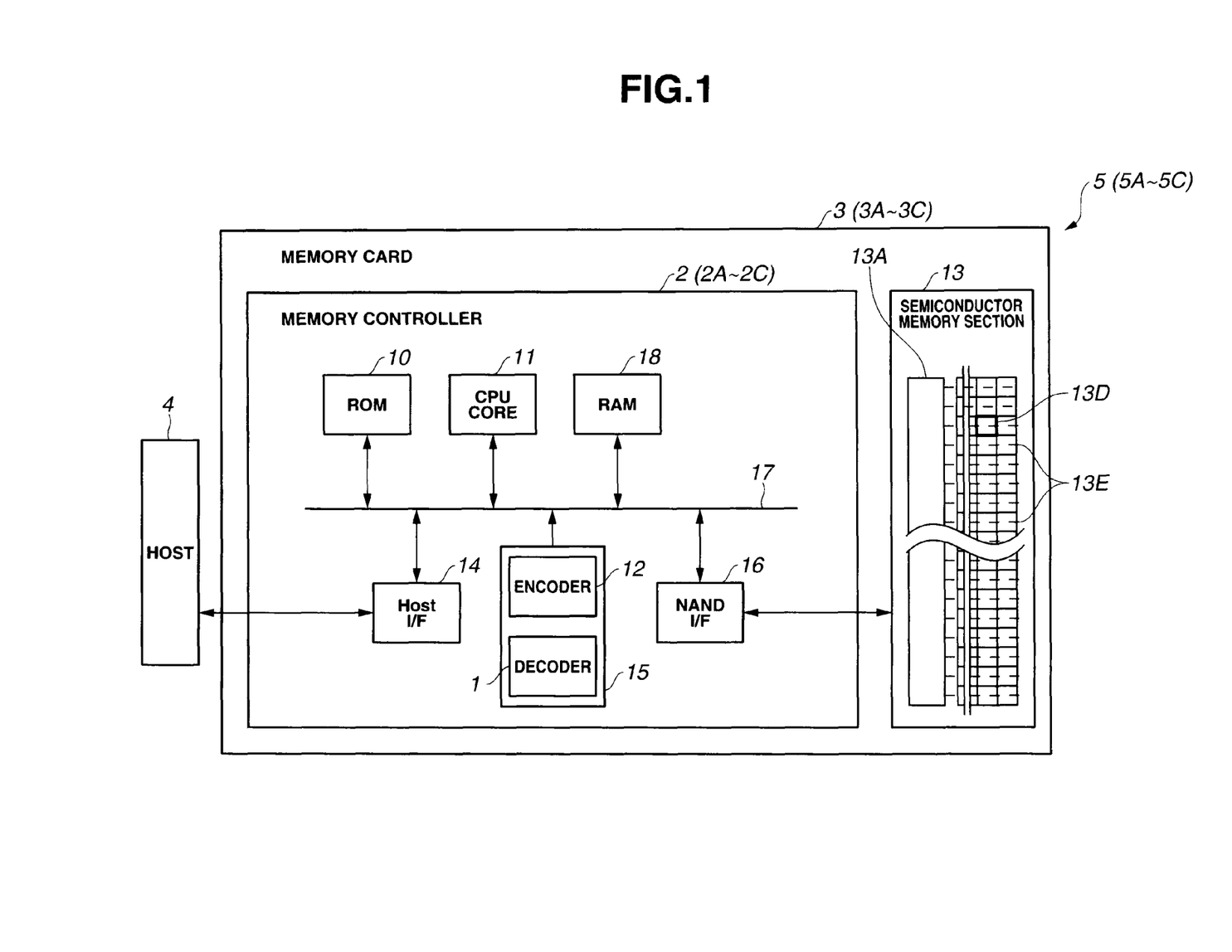
FIG. 1 is a configuration diagram showing a schematic configuration of a memory system in a first embodiment.

First, a memory system 5 and a control method for the memory system 5 in a first embodiment of the present invention will be described using FIGS. 1 and 2. As shown in FIG. 1, the memory system 5 includes a host 4 such as a personal computer or a digital camera, and a memory card 3 that is a storage apparatus detachably connected with the host 4. The host 4 sends and receives data to and from the memory card 3 under the control of a host CPU (not shown).

The memory system may have a host and what is called an embedded-type storage apparatus accommodated inside the host and configured to store startup data for the host and the like, and the storage apparatus may be in a form such as a semiconductor disk: SSD (Solid State Drive). Alternatively, the memory system may function as a mobile music player and the like into which a storage apparatus corresponding to the memory card 3 and a host are integrated.

As shown in FIG. 1, the memory card 3, which is a storage apparatus, has a semiconductor memory section 13 and a memory controller 2. The semiconductor memory section 13 is a flash memory section and has a structure in which many memory cells 13D, which are unit cells, are connected such as via word lines 13E for applying a read voltage controlled by a word line control section 13A to the memory cells 13D.

The memory cells 13D of the memory card 3 are multivalue memory cells capable of storing N-bit (N is a natural number not smaller than 2) data per memory cell based on threshold voltage distributions. The following description will be made by taking 8-value memory cells with N=3 as an example.

The memory controller 2 has a ROM 10, a CPU core 11, a RAM 18, a host I/F (interface) 14, an error check and correction section (hereinafter referred to as an "ECC section") 15, and a NAND I/F (interface) 16, connected with each other via a bus 17.

The memory controller 2 sends and receives data to and from the host 4 via the host I/F 14 and to and from the memory section 13 via the NAND I/F 16 under the control of the CPU core 11. The memory controller 2 implements address management of the memory section 13 through FW (Firm Ware) executed by the CPU core 11. Control over the entire memory card 3 is also executed by the CPU core 11 through FW according to command inputs from the host 4. The ROM 10 stores a control program for the memory card 3, and the like. The RAM 18 stores an address conversion table necessary in the address management, and the like.

The ECC section 15 has an encoder 12 configured to generate and add an error correcting code when data is stored, and a decoder 1 configured to decode, when data is read, the coded data read. The ECC section 15 in the present embodiment uses an LDPC code, which is a soft decision decoding code subjected to soft decision decoding processing through probability-based repeated calculations. Of course, the ECC section 15 may be configured to use a concatenated code composed of a soft decision decoding code and a hard decision decoding code.

Figure 2:
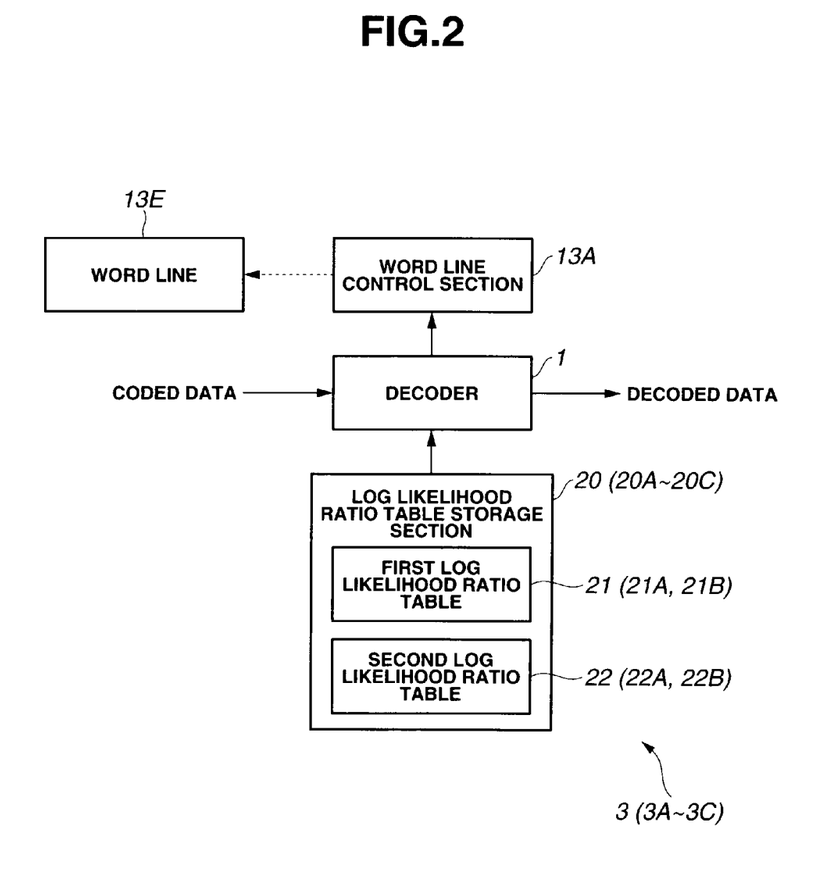
FIG. 2 is a configuration diagram showing a configuration of the memory system in the first embodiment.

As shown in FIG. 2, the memory card 3 has a word line control section 13A configured to perform control of applying a predetermined read voltage to the memory cell 13D via the word line 13E, an LLR table storage section 20 that is a storage section configured to store LLR tables based on read voltages, and a decoder 1 configured to perform soft decision decoding processing using an LLR. The LLR table storage section 20 stores a first LLR table 21 and a second LLR table 22.

The LLR table storage section 20 may be part of the ROM 10, or may be transferred from the ROM 10 to the RAM 18 to become part of the RAM 18 upon startup of the memory card 3, or may reside in the ECC section 15.

Now, operation of the memory system 5 in the present embodiment will be described.

Data sent from the host 4 to the memory card 3 is encoded by the encoder 12 and stored as coded data in the semiconductor memory section 13. When a read instruction is provided from the host 4, the coded data is read from the semiconductor memory section 13 under the control of the CPU core 11 and subjected to decoding processing by the decoder 1. The data after the decoding processing is sent to the host 4.

In decoding processing on coded data encoded using an LDPC code, an LLR indicating the likelihood of the data is first calculated based on an LLR table from the data read at a predetermined read voltage. The absolute value $|\lambda|$ of a log likelihood ratio (LLR) $\lambda$ is called a reliability. A greater reliability means a higher reliability, whereas a reliability closer to 0 means a lower reliability. In the LDPC decoding processing, based on the LLR, error correction processing is performed using soft decision decoding processing through probability-based repeated calculations.

Figure 3:
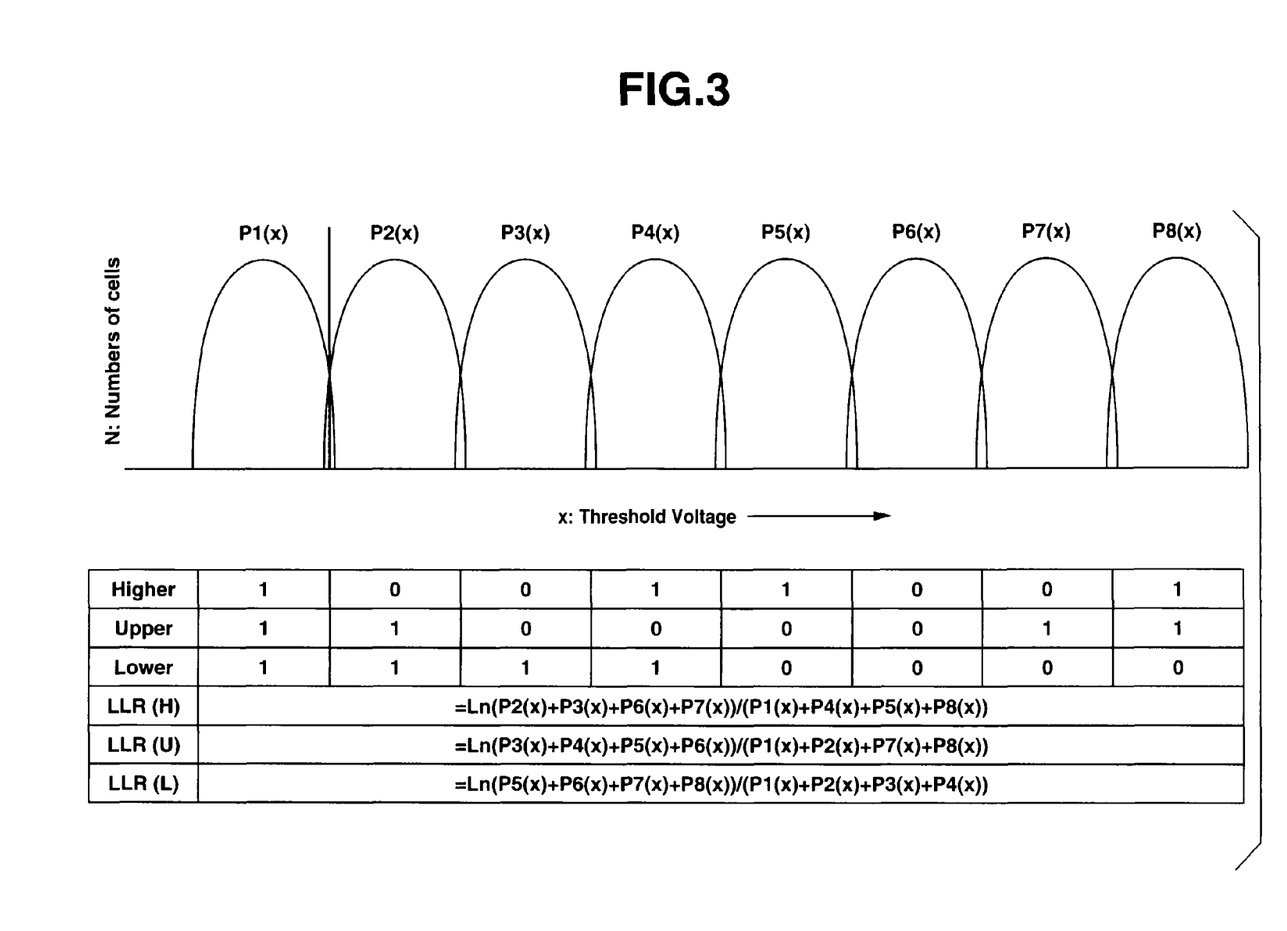
FIG. 3 is an illustrative diagram showing a relationship among threshold voltage distributions, stored data, and an LLR table.

In the memory system 5 in the present embodiment, the relationship between threshold voltages and LLRs is calculated beforehand and stored in the LLR table storage section 20. For example, as in FIG. 3, among $2^3$ (8) types of threshold voltage distributions, a threshold voltage distribution for a 3-bit memory cell storing data (111) is P1(x). Then, a higher bit LLR (H), an upper bit LLR (U), and a lower bit LLR (L) of the data are calculated with equations in FIG. 3, respectively. That is, LLRs calculated from the probability that each bit is either "0" or "1" are stored as the LLR table.

However, although the same data is stored, the threshold voltage differs from one memory cell from another for reasons such as variations at the time of manufacturing the memory cells. That is, threshold voltages of a plurality of memory cells that store the same data show a predetermined distribution. The reliability of data read at a voltage in the vicinity of the center of the threshold voltage distribution is high, whereas the reliability of data read at a voltage in the vicinity of an upper limit or lower limit of the threshold voltage distribution is low.

Figure 4:
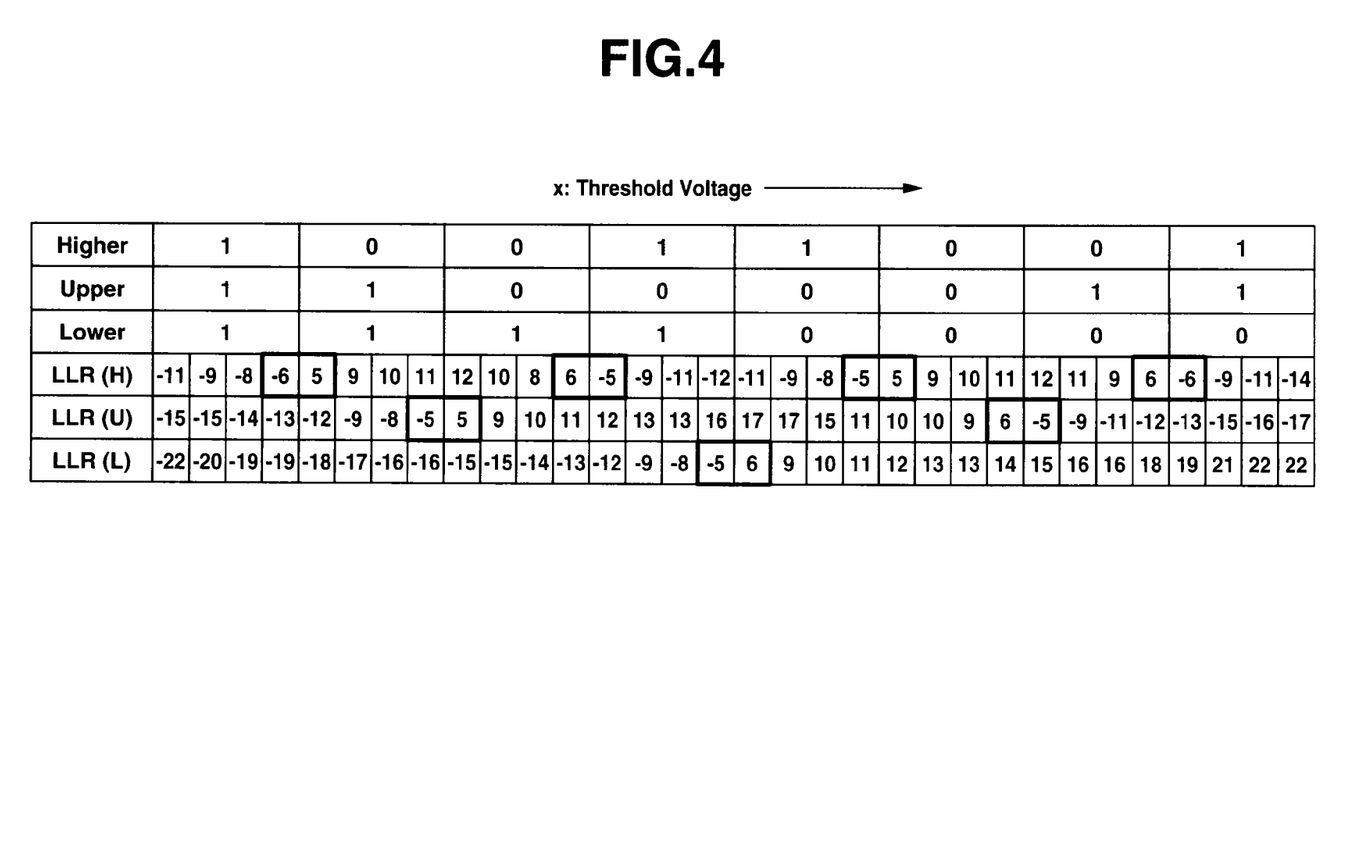
FIG. 4 is an exemplary LLR table of a known memory system, where an abscissa corresponds to threshold voltages and a right-hand side of the figure is a high-voltage side.

Therefore, as shown in FIG. 4 for example, each threshold voltage distribution is divided into four ranges with reference to a median value, and LLRs for predetermined threshold voltages in each range are stored as the LLR table. The threshold voltage distribution may be divided into more or less than four ranges, and may not be uniformly divided at substantially equal intervals. For example, the LLR suddenly changes with respect to the threshold voltage at certain points, and the threshold voltage distribution is preferably divided based on those points.

Figure 5A:
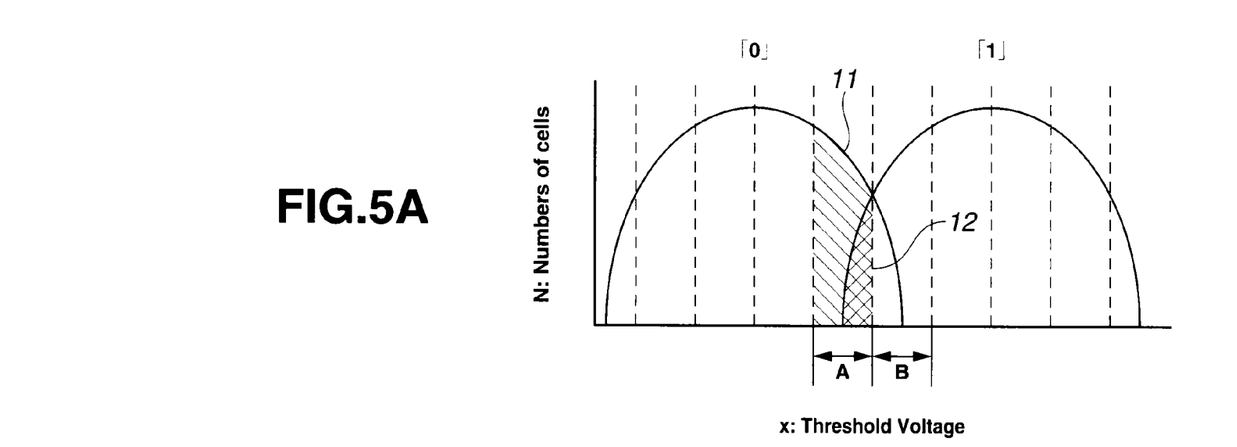

As already described, the threshold voltage differs from one memory cell from another although the same data is stored. Furthermore, the threshold voltage distributions may be shifted with respect to the threshold voltages. Here, as shown in FIG. 5A, in a threshold voltage range A, (the area of a region 11 corresponding to a memory cell with data 0)>(the area of a region 12 corresponding to a memory cell with data 1) at the time the LLR table was generated, therefore the data is "0" and the LLR of the data is a positive value calculated with (the area of the region 11)/(the area of the region 12), for example. On the other hand, in a threshold voltage range B, the data is "1" and the LLR of the data is a negative value. That is, the location shown in FIG. 5A is where the sign is inverted between two adjacent LLRs.

Figure 5B:
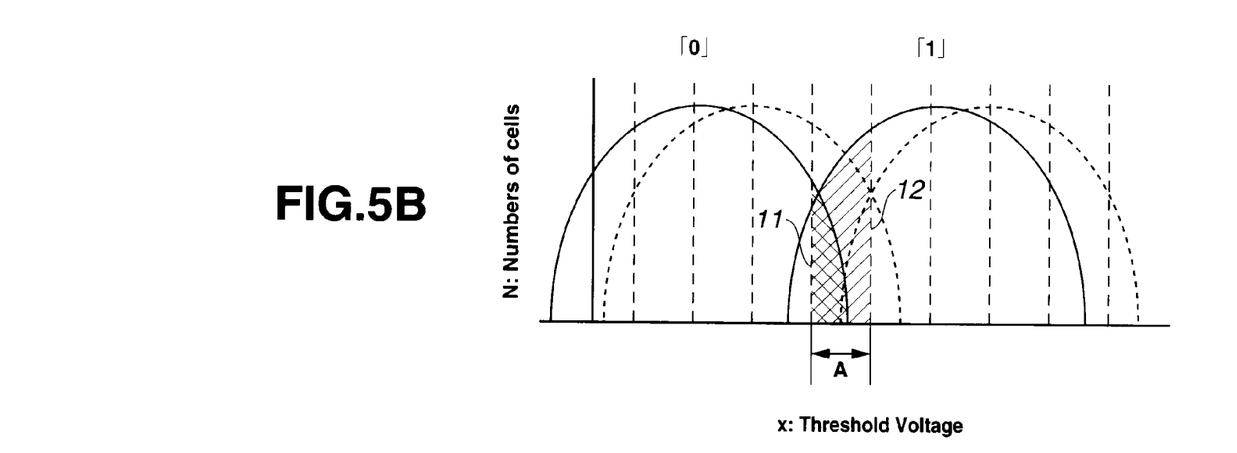

In this case, as shown in FIG. 5B, if the threshold voltage distributions are shifted to the left, i.e., if the threshold voltages are shifted to the low-voltage side, and thereby optimal read levels are shifted, then the data is actually "1" in the threshold voltage range A because (the area of the region 11)<(the area of the region 12), and the LLR of the data is a negative value calculated with (the area of the region 11)/(the area of the region 12).

That is, a phenomenon of incorrect inversion of the sign of the LLR, i.e., error processing of decoding the data "0" into "1," occurs. Since the LDPC decoding processing involves performing decoding processing through iteration processing in which many pieces of bit data exchange LLR information with each other, an incorrect value of any bit data will affect the entire code processing, causing decreases in the correction ability and the processing speed.

Figure 6:
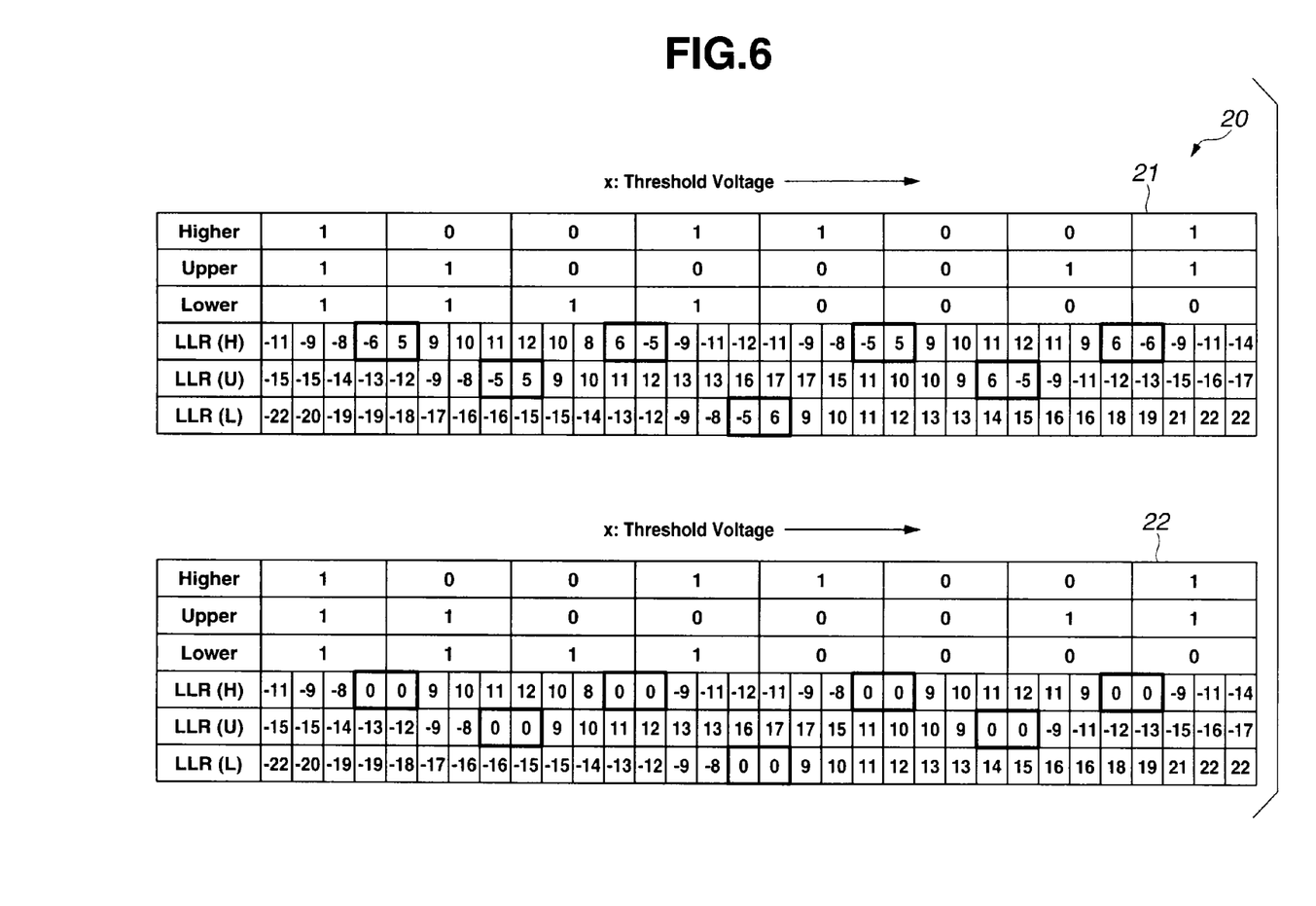
FIG. 6 shows LLR tables of the memory system in the first embodiment.

Therefore, as shown in FIG. 6, in addition to the first LLR table 21 that consists of normal LLR data corresponding to predetermined threshold voltages, the memory system 5 in the present embodiment has the second LLR table 22. The first LLR table 21 that consists of normal LLR data is a table storing LLRs corresponding to average threshold voltage distributions for many memory cells.

On the other hand, the second LLR table 22 consists of LLR data such that two LLRs at each location corresponding to each location in the first LLR table at which the sign is inverted between two adjacent LLRs are 0. That is, the second LLR table 22 is a table storing LLRs corresponding to threshold voltage distributions that take into account variations among the memory cells and the like.

For example, in the first LLR table 21 shown in the upper layer in FIG. 6, the LLR (H) at the border between data (HUL) (001) and (101) are "6" and "−5," and the sign is inverted at this location. On the other hand, in the second LLR table 22 shown in the lower layer in FIG. 6, the LLR (H) at the border between the data (HUL) (001) and (101) are both "0." That is, the LLRs that were "6" or "−5" are now "0."

The decoder 1 of the memory system 5 uses an LLR calculated from the first LLR table 21 or the second LLR table 22 to perform decoding processing through probability-based repeated calculations (iteration processing).

Since an LLR of "0" means that the reliability is the lowest, the data is treated as unknown as to whether "0" or "1" initially in the iteration processing. Therefore, whether the data is "1" or "0," adverse effect on the entire LDPC decoding processing will be small.

Figure 7:
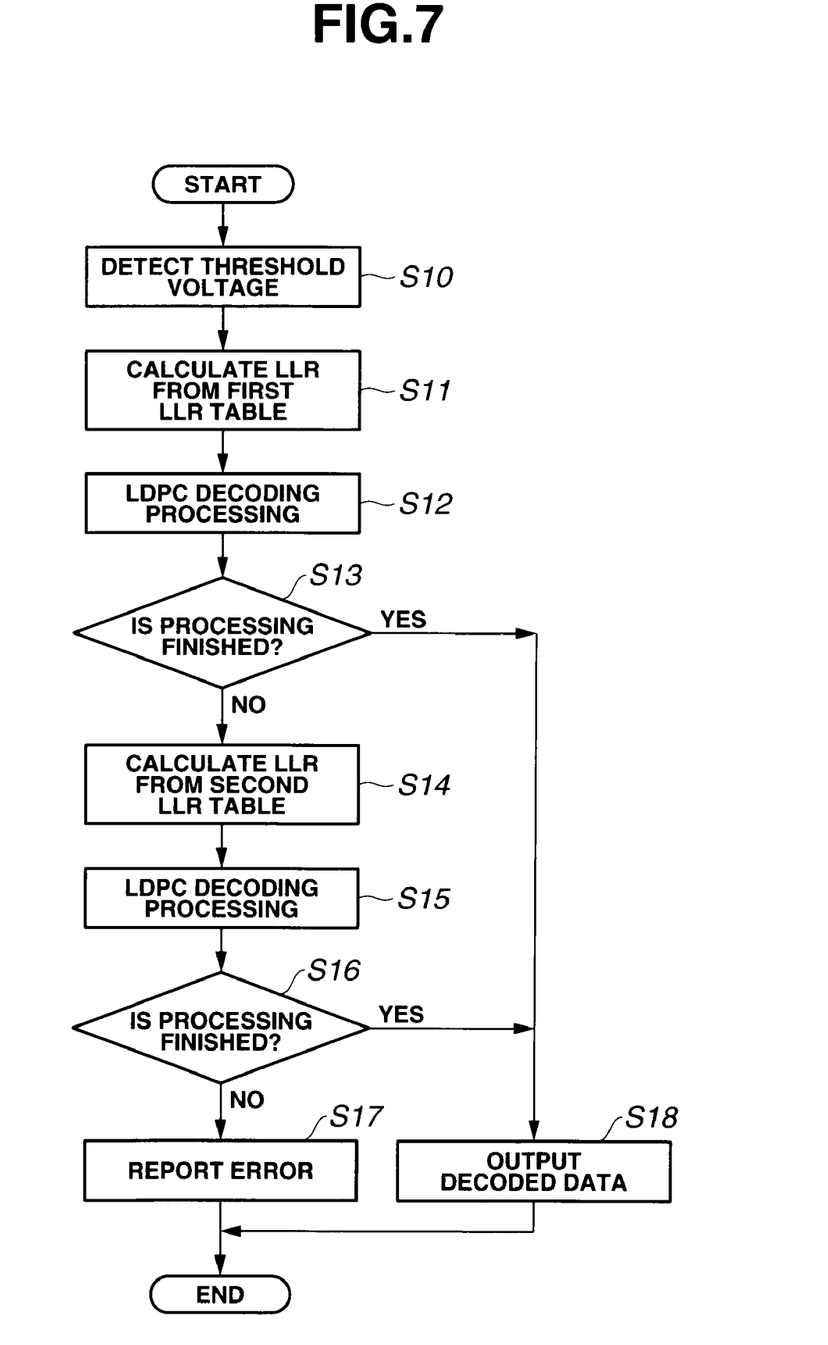
FIG. 7 is a flowchart for describing an operation flow of the memory system in the first embodiment.

Now, the decoding processing in the memory system 5 in the present embodiment will be described according to a flowchart of FIG. 7.

<Step S10>

A threshold voltage of a memory cell is detected with a voltage applied to the word line 13E. This threshold voltage detection step only determines whether the threshold voltage is higher or lower than a predetermined read level voltage and does not detect a specific value of the threshold voltage.

<Step S11>

An LLR is calculated from the detected threshold voltage and the first LLR table 21 stored in the LLR table storage section 20.

<Step S12>

The LDPC decoding processing is performed in units of predetermined number of pieces of bit data.

<Step S13>

If the decoding processing is finished within a predetermined maximum number of iterations, for example N1 iterations (Yes), the decoded data is transferred to the host in step S18.

<Step S14>

If the decoding processing is not finished after performing the processing for the predetermined maximum number of iterations in S13 (No), an LLR is calculated from the detected threshold voltage and the second LLR table 22.

<Step S15>

The LDPC decoding processing is performed in units of predetermined number of pieces of bit data.

<Step S16>

If the decoding processing is finished within a predetermined maximum number of iterations, for example N2 iterations (Yes), the decoded data is transferred to the host in step S18.

<Step S17>

If the decoding processing is not finished after performing the processing for the predetermined maximum number of iterations in S16 (No), an error command is sent to the host, for example.

As described above, the memory system 5, the memory card 3, and the memory controller 2 in the present embodiment have the LLR table storage section 20 configured to store the first LLR table that consists of normal LLR data corresponding to predetermined threshold voltages, and the second LLR table that consists of LLR data such that absolute values of two LLRs at each location corresponding to each location in the first LLR table at which the sign is inverted between two adjacent LLRs are smaller than absolute values of the respective LLRs in the first LLR table. If the decoding processing using an LLR calculated from the first LLR table and the threshold voltage results in an error, the decoding processing is performed using an LLR calculated from the second LLR table and the threshold voltage. Specifically, the two LLRs at the corresponding location in the second LLR table are preferably both "0."

The control method for the memory system 5 in the present embodiment includes; detecting a threshold voltage of a semiconductor memory cell storing N-bit coded data based on $2^N$ (N is a natural number not smaller than 2) threshold voltage distributions; calculating a first LLR from a first LLR table that consists of normal LLR data corresponding to predetermined threshold voltages and from the detected threshold voltage; performing first LDPC decoding in which iteration decoding processing is performed based on the first LLR; calculating, if the first LDPC decoding fails, a second LLR from a second LLR table that consists of LLR data such that absolute values of two LLRs at each location corresponding to each location in the first LLR table at which the sign is inverted between two adjacent LLRs are smaller than absolute values of respective LLRs in the first LLR table and from the detected threshold voltage; and performing second LDPC decoding in which iteration decoding processing is performed based on the second LLR.

As described above, the memory system 5 and the control method for the memory system 5 realize high error correction ability.

Second Embodiment

Hereinafter, a memory system 5A and a control method for the memory system 5A in a second embodiment of the present invention will be described with reference to the drawings. Since the memory system 5A in the second embodiment is similar to the memory system 5 in the first embodiment, description of the same components will be omitted.

An LLR table storage section 20A of the memory system 5A in the present embodiment stores a second LLR table 22A different from the one in the memory system 5 in the first embodiment. That is, the LLR table storage section 20A has a first LLR table 21A, which is the same as the first LLR table 21 and consists of normal LLR data corresponding to predetermined threshold voltages, and the second LLR table 22A. The second LLR table 22A is such that the difference between absolute values of two LLRs at each location corresponding to each location in the first LLR table 21A at which the sign is inverted between two adjacent LLRs are greater than the difference in the first LLR table 21A, and the absolute value of the LLR (first LLR) for threshold voltages on the high-voltage side in the two LLRs is greater than the absolute value of the LLR (second LLR) on the low-voltage side.

Figure 8:
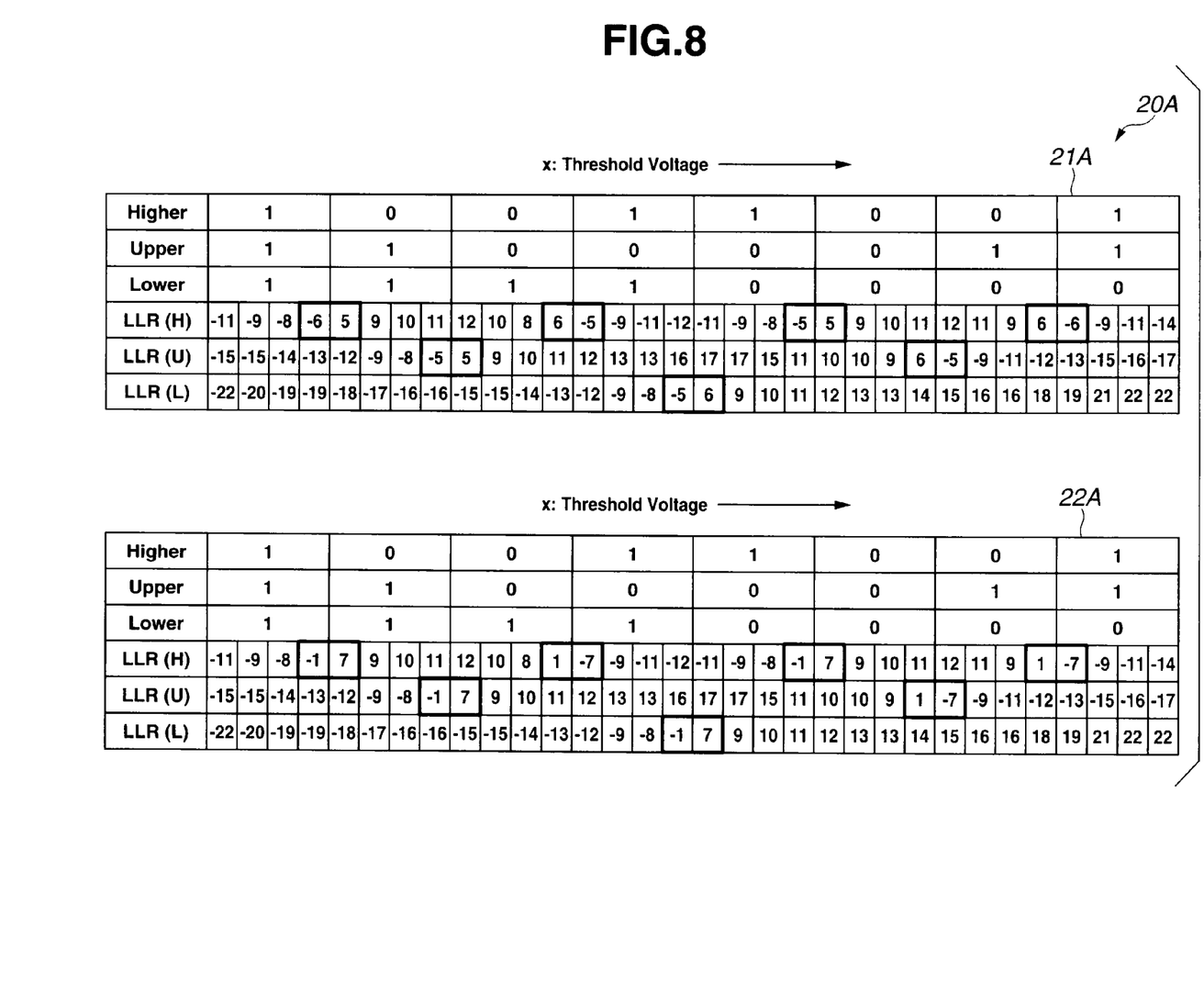
FIG. 8 shows LLR tables of a memory system in a second embodiment.

That is, the memory system 5A has the second LLR table 22A shown in FIG. 8 that assumes the case shown in FIG. 5B where the threshold voltage distributions are shifted to the low-voltage side or the read levels are shifted to the high-voltage side.

The first LLR and the second LLR are determined as appropriate. For example, an LLR with the smallest absolute value among LLRs in the first LLR table 21A is set as a reference LLR, so that the absolute value of the first LLR is greater than the absolute value of the reference LLR, and the absolute value of the second LLR is smaller than the absolute value of the reference LLR.

In the first LLR table 21A stored in the LLR table storage section 20A shown in the upper layer in FIG. 8, the smallest one of absolute values of LLRs at locations at which the sign is inverted between two adjacent LLRs shown as being surrounded by bold frames is "5," and the maximum difference between the absolute values is "1." In the second LLR table 22A stored in the LLR table storage section 20A shown in the lower layer in FIG. 8, the absolute value of the first LLR is "7" and the absolute value of the second LLR is "1" at locations (bold frames) corresponding to the locations in the first LLR table 22A at which the sign is inverted between two adjacent LLRs.

In addition to the advantage of the memory system 5 in the first embodiment and the like, the memory system 5A and the control method for the memory system 5A in the above embodiment realize higher error correction ability than the memory system 5 if the threshold voltage distributions or the read levels are shifted.

Variation of Second Embodiment

Figure 9A:
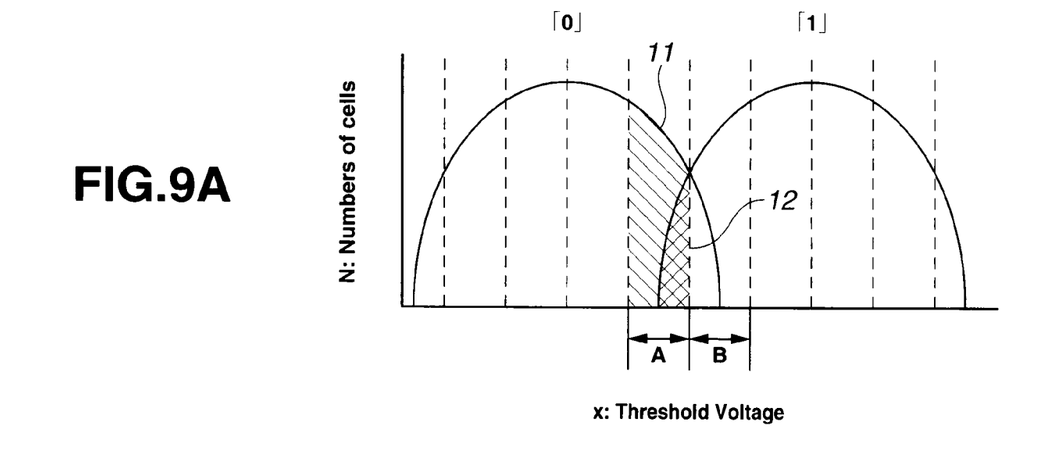

Hereinafter, a memory system 5B and a control method for the memory system 5B in a variation of the second embodiment of the present invention will be described with reference to FIGS. 9A, 9B, and 10. Since the memory system 5B in the present variation is similar to the memory system 5A in the second embodiment, description of the same components will be omitted.

The memory system 5A has the second LLR table 22A that assumes the case as shown in FIG. 5B where the threshold voltage distributions are shifted to the low-voltage side or the read levels are shifted to the high-voltage side. In contrast, the memory system 5B assumes a case where the threshold voltage distributions are shifted to the high-voltage side or the read levels are shifted to the low-voltage side as shown in FIG. 9B.

Figure 9B:
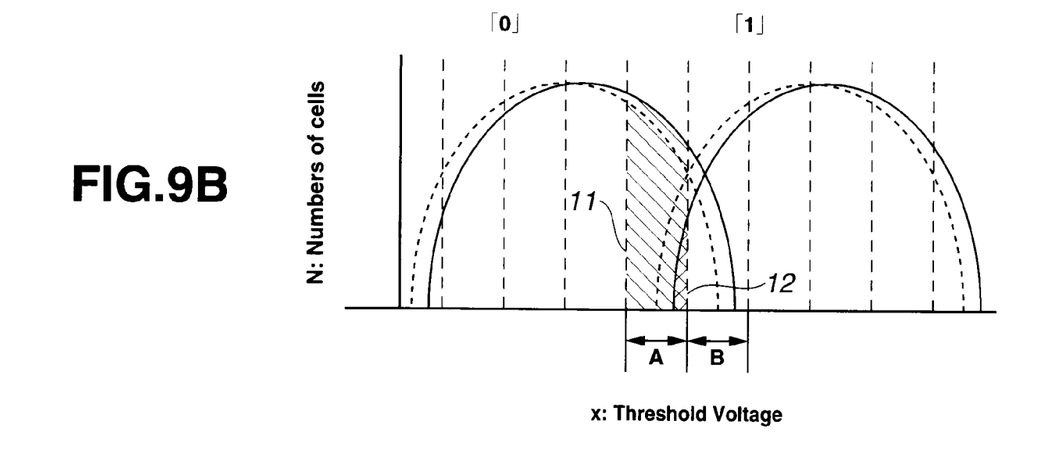

That is, as shown in FIG. 9B, if the threshold voltage distributions are shifted to the right, i.e., if the threshold voltages are shifted to the high-voltage side, and thereby the optimal read levels are shifted, then (the area of the region 11)>>(the area of the region 12) and the reliability increases in the threshold voltage range A. However, the reliability decreases in the threshold voltage range B.

Figure 10:
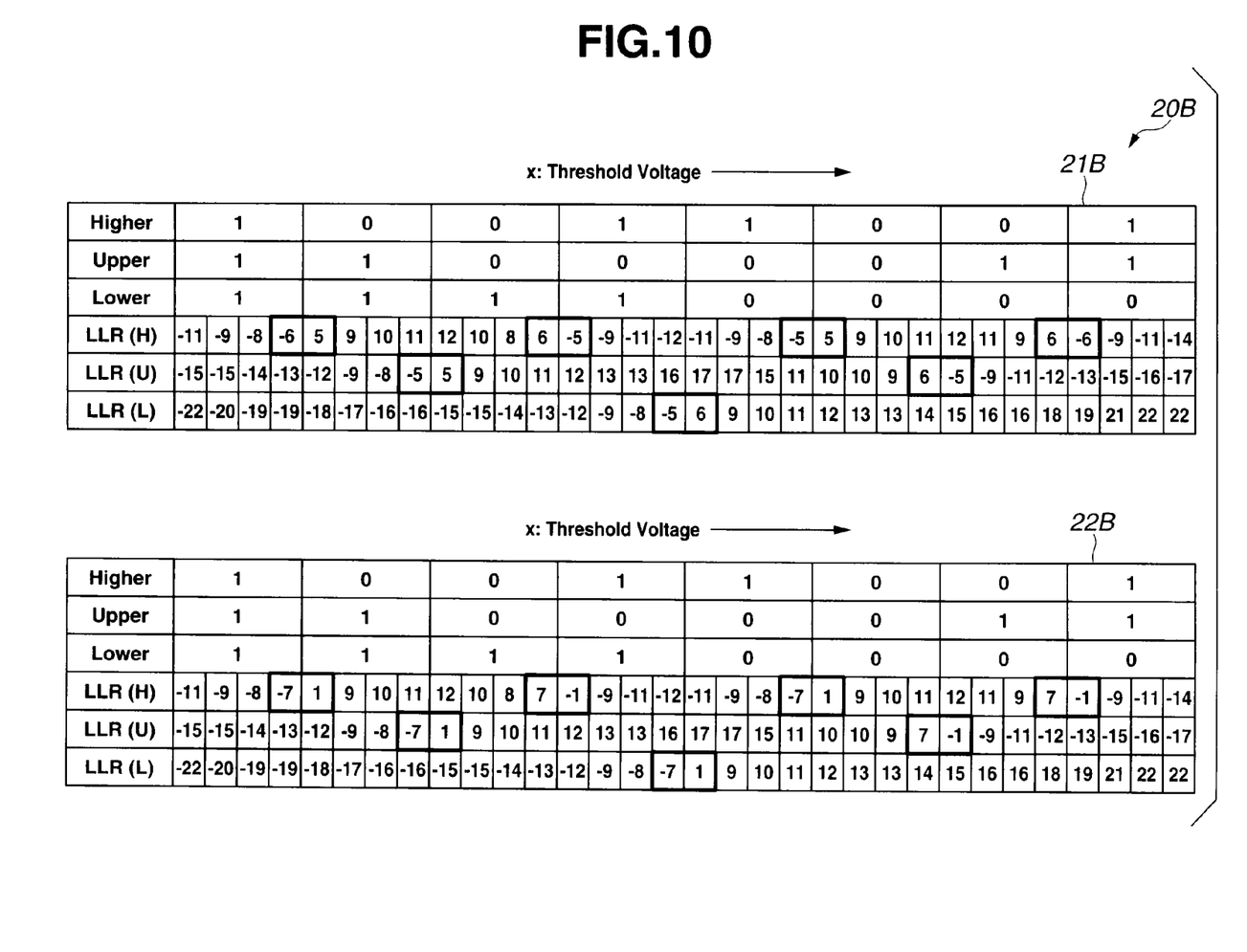
FIG. 10 shows LLR tables of a memory system in a variation of the second embodiment.

Therefore, as the second LLR table, the memory system 5B has a second LLR table B (22B) shown in the lower layer in FIG. 10. A first LLR table 21B and the second LLR table B (22B) stored in an LLR table storage section 20B and illustrated in FIG. 10 use "1" as the absolute value of the first LLR and "7" as the absolute value of the second LLR. That is, in the second LLR table B, the absolute values of the first LLR and the second LLR are the reverse of the case in the second LLR table A (22A) of the memory system 5A.

In addition to the advantage of the memory system 5 in the first embodiment and the like, the memory system 5B and the control method for the memory system 5B in the above variation realize higher error correction ability than the memory system 5A and the like if the threshold voltage distributions or the read levels are shifted.

Third Embodiment

Hereinafter, a memory system 5C and a control method for the memory system 5C in a third embodiment of the present invention will be described with reference to the drawings. Since the memory system 5C in the third embodiment is similar to the memory system 5A in the second embodiment and the like, description of the same components will be omitted.

The memory system 5A has the second LLR table A (22A) that assumes the case shown in FIG. 5B where the threshold voltage distributions are shifted to the low-voltage side, and the memory system 5B has the second LLR table B (22B) that assumes the case where the threshold voltage distributions are shifted to the high-voltage side.

In contrast, the memory system 5C has an LLR table storage section 20C configured to store, as the second LLR table, the second LLR table A (22A) and the second LLR table B (22B). Hereinafter, the second LLR table A will also be referred to as a third LLR table, and the second LLR table B will also be referred to as a fourth LLR table. In other words, the second LLR table in the memory system 5C has the third LLR table 22A and the fourth LLR table 22B.

Figure 11:
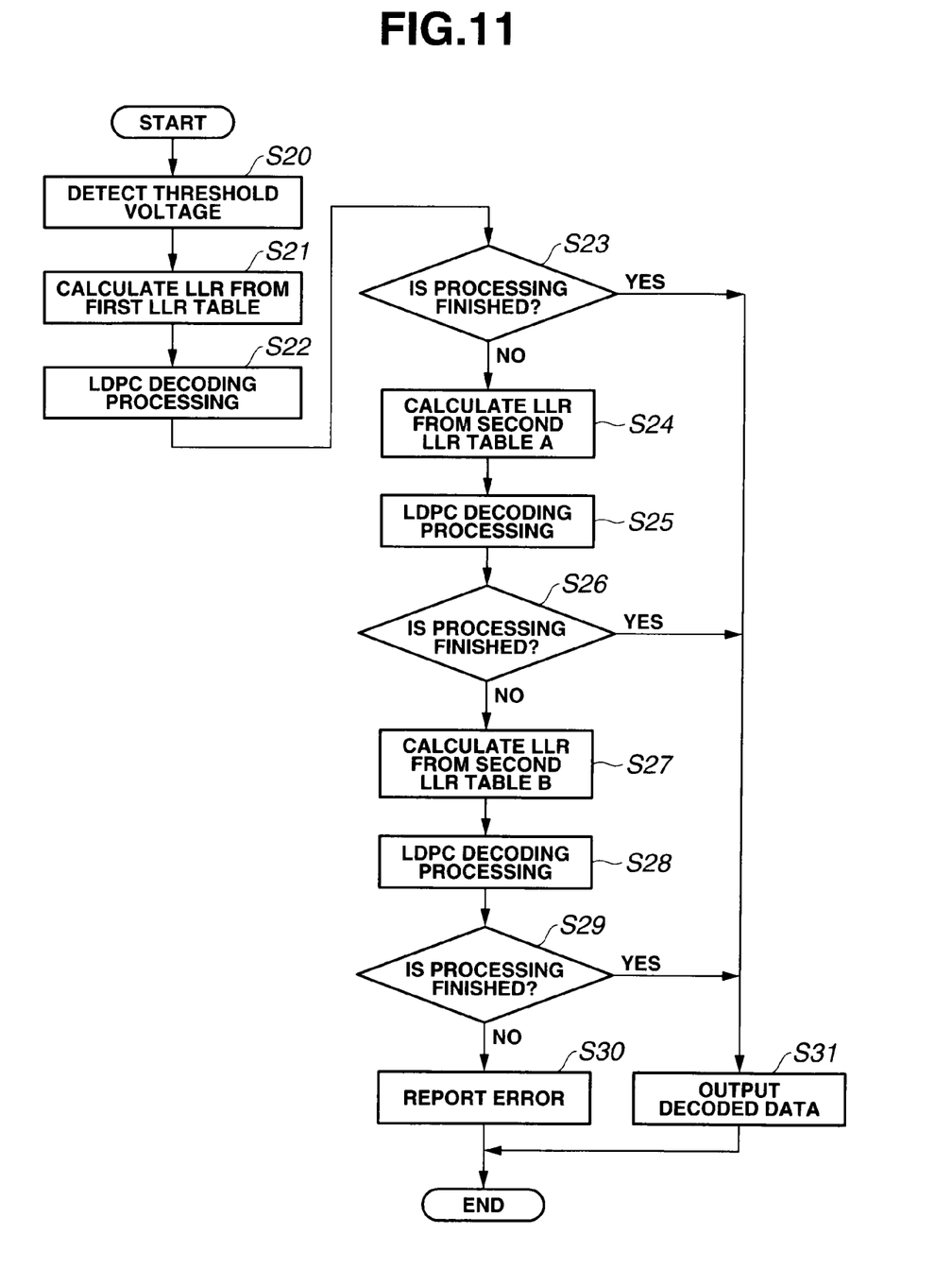
FIG. 11 is a flowchart for describing an operation flow of a memory system in a third embodiment.

FIG. 11 is a flowchart for describing an operation flow of the memory system 5C. As shown in FIG. 11, in the memory system 5C, if decoding processing with an LLR calculated using the normal LLR table (the first LLR table) fails, decoding processing with an LLR calculated from the third LLR table 22A is performed. If this decoding processing further fails, decoding processing with an LLR calculated from the fourth LLR table 22B is performed.

Alternatively, if decoding processing with an LLR calculated using the normal LLR table (the first LLR table) fails, decoding processing with an LLR calculated from the fourth LLR table 22B may be performed. If this decoding processing further fails, decoding processing with an LLR calculated from the third LLR table 22A may be performed.

The memory system 5C is capable of decoding processing in either of cases where the threshold voltage distributions or the read levels are shifted to the high-voltage side or the low-voltage side. Thus, the memory system realizes high reliability in the decoding processing.

<Additional Description>

According to an aspect of the present invention of this application, there is provided a memory system having a host and a storage apparatus, including: a plurality of semiconductor memory cells, each cell being configured to store N-bit coded data based on $2^N$ (N is a natural number not smaller than 2) threshold voltage distributions; a storage section configured to store a first LLR table that consists of normal LLR data corresponding to predetermined threshold voltages and a second LLR table that consists of LLR data such that absolute values of two LLRs at each location corresponding to each location in the first LLR table at which a sign is inverted between two adjacent LLRs are different from absolute values of the respective LLRs in the first LLR table; and a decoder configured to perform decoding processing through probability-based repeated calculations using an LLR calculated from the first or second LLR table and the threshold voltage, wherein if the decoding processing using the LLR calculated from the first LLR table and the threshold voltage results in an error, the decoding processing using the LLR calculated from the second LLR table and the threshold voltage is performed.

According to another aspect of the present invention, there is provided a control method for a memory system, including: detecting a threshold voltage of semiconductor memory cells, each cell being configured to storing N-bit coded data based on $2^N$ (N is a natural number not smaller than 2) threshold voltage distributions; calculating a first LLR from a first LLR table that consists of normal LLR data corresponding to predetermined threshold voltages and from the detected threshold voltages; performing first LDPC decoding in which decoding processing is performed based on the first LLR; calculating, if the first LDPC decoding fails, a second LLR from a second LLR table that consists of LLR data such that absolute values of two LLRs at each location corresponding to each location in the first LLR table at which a sign is inverted between two adjacent LLRs are smaller than absolute values of the respective LLRs in the first LLR table and from the detected threshold voltage; and performing second LDPC decoding in which decoding processing is performed based on the second LLR.

The memory systems 5 and 5A to 5C and the control methods for the memory systems 5 and 5A to 5C in the above-described embodiments provide enhanced memory systems with high error correction ability capable of error correction with a high probability even if the threshold voltage distributions are shifted. The memory systems also realize a high processing speed that may allow a significant reduction in the decoding processing time because of the capability of performing processing by switching between the LLR tables. The same advantages as described above are also achieved when any of the memory cards 3 and 3A to 3C, which are the storage apparatuses of the memory systems 5 and 5A to 5C, or any of the memory controller 2 and 2A to 2C is used in combination with other components.

The same advantages as described above are also achieved when the memory card 3, which is the storage apparatus of the memory system 5 and the like, the memory controller 2, the ECC section 15, or the decoder 1 is used in combination with other components.

The memory system 5 and the like with 8-value storage memory cells with N=3 have been taken as an example in the above description. However, the advantages of the present invention are also achieved in memory systems such as a memory system with 4-value storage memory cells with N=2 and a memory system with 16-value storage memory cells with N=4. Rather, as N increases, the advantages of the present invention become noticeable. That is, although N is 2 or more, the advantages of the present invention are noticeable when N is 3 or more or 4 or more. The upper limit of N is 7 or less from the standpoint of industrial implementation.

The code is not limited to an LDPC code as long as the code is decoded through probability-based repeated calculations. The type of a decoding algorithm used may be any one of sum-product decoding, min-sum decoding, and normalized min-sum decoding algorithms.

The threshold voltage distributions may change with temporal changes, for example an increase in the number of times of reading. Therefore, control may be performed to preferentially use the second LLR table 22 if the number of times of reading reaches a predetermined number or more. Alternatively, if the second LLR table 22 has been used to calculate the LLR successively for a predetermined number of times or more, for example ten times or more, control may be performed to preferentially use the second LLR table 22 subsequently. Then, if the first LLR table 21 has been used to calculate the LLR successively for a predetermined number of times or more, for example ten times or more, control may be performed to again preferentially use the first LLR table 21 subsequently.

Of course, the LLR table preferentially used may be changed for each memory cell or each particular group of memory cells. Furthermore, control may be performed to preferentially use the second LLR table 22 if the accumulated use time of the memory card exceeds a predetermined amount of time. Furthermore, for a particular group of memory cells, for example a group of memory cells that have been read many times, control may be performed to calculate the LLR using the second LLR table 22 after a lapse of an accumulated use time shorter than an accumulated use time for groups of memory cells that have been read fewer times.

The upper limit value N1 of the number of iterations of the LDPC decoding processing using the first LLR table 21 may be set to a value smaller than the upper limit value N2 of the number of iterations of the LDPC decoding processing using the second LLR table 22.

For the case where the third LLR table and the fourth LLR table are provided, control can be performed in a similar manner as described above.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a storage apparatus including a plurality of semiconductor memory cells, each cell being configured to store N-bit coded data based on $2^N$ (N is a natural number not smaller than 2) threshold voltage distributions;
a storage section configured to store a first LLR table that consists of normal LLR data corresponding to predetermined threshold voltages and a second LLR table that consists of LLR data such that absolute values of two LLRs at each location corresponding to each location in the first LLR table at which a sign is inverted between two adjacent LLRs are different from absolute values of the respective LLRs in the first LLR table; and
a decoder configured to, when performing decoding processing through probability-based repeated calculations using an LLR calculated from the first or second LLR table and the threshold voltage,
perform the decoding processing using the LLR calculated from the second LLR table and the threshold voltage if the decoding processing using the LLR calculated from the first LLR table and the threshold voltage results in an error.

2. The memory system according to claim 1, wherein N is not greater than 7.

3. The memory system according to claim 2, wherein the absolute values of the two LLRs at the corresponding location in the second LLR table are smaller than the absolute values of the respective LLRs in the first LLR table.

4. The memory system according to claim 3, wherein values of the two LLRs at the corresponding location in the second LLR table are both "0."

5. The memory system according to claim 2, wherein a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is greater than the absolute value of the LLR on the other side, so that a case where the threshold voltage distributions are shifted to a low-voltage side is assumed.

6. The memory system according to claim 2, wherein a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is smaller than the absolute value of the LLR on the other side, so that a case where the threshold voltage distributions are shifted to the high-voltage side is assumed.

7. The memory system according to claim 2, wherein the second LLR table comprises:
a third LLR table in which a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is greater than the absolute value of the LLR on the other side, so that a case where the threshold voltage distributions are shifted to a low-voltage side is assumed; and
a fourth LLR table in which a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on the high-voltage side in the two LLRs at the corresponding location is smaller than the absolute value of the LLR on the other side, so that a case where the threshold voltage distributions are shifted to the high-voltage side is assumed, and wherein the decoder performs the decoding processing using at least either one of the third LLR table and the fourth LLR table as the second LLR table.

8. The memory system according to claim 7, wherein if the decoding processing using an LLR calculated from the third or fourth LLR table and the threshold voltage results in an error, the decoder performs the decoding processing using an LLR calculated from the other LLR table and the threshold voltage.

9. A control method for a memory system, comprising:
detecting threshold voltages of semiconductor memory cells, each cell storing N-bit coded data based on $2^N$ (N is a natural number not smaller than 2) threshold voltage distributions;
calculating a first LLR from a first LLR table that consists of normal LLR data corresponding to predetermined threshold voltages and from the detected threshold voltages;
performing first LDPC decoding in which decoding processing is performed based on the first LLR;
calculating, if the first LDPC decoding fails, a second LLR from a second LLR table that consists of LLR data such that absolute values of two LLRs at each location corresponding to each location in the first LLR table at which a sign is inverted between two adjacent LLRs are smaller than absolute values of the respective LLRs in the first LLR table and from the detected threshold voltage; and
performing second LDPC decoding in which decoding processing is performed based on the second LLR.

10. The control method for a memory system according to claim 9, wherein
N is not greater than 7.

11. The control method for a memory system according to claim 10, wherein
the absolute values of the two LLRs at the corresponding location in the second LLR table are smaller than the absolute values of the respective LLRs in the first LLR table.

12. The control method for a memory system according to claim 11, wherein
values of the two LLRs at the corresponding location in the second LLR table are both "0."

13. The control method for a memory system according to claim 10, wherein
a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is greater than the absolute value of the LLR on the other side, so that a case where the threshold voltage distributions are shifted to a low-voltage side is assumed.

14. The control method for a memory system according to claim 10, wherein a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is smaller than the absolute value of the LLR on the other side, so that a case where the threshold voltage distributions are shifted to the high-voltage side is assumed.

15. The control method for a memory system according to claim 10, wherein
the second LLR table comprises:
a third LLR table in which a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on a high-voltage side in the two LLRs at the corresponding location is greater than the absolute value of the LLR on the other side, so that a case where the threshold voltage distributions are shifted to a low-voltage side is assumed; and
a fourth LLR table in which a difference between the absolute values of the two LLRs at the corresponding location in the second LLR table is greater than a difference between the absolute values of the two LLRs at the location in the first LLR table at which the sign is inverted between the LLRs, and the absolute value of every LLR for threshold voltages on the high-voltage side in the two LLRs at the corresponding location is smaller than the absolute value of the LLR on the other side, so that a case where the threshold voltage distributions are shifted to the high-voltage side is assumed, and wherein
the decoding processing is performed using at least either one of the third LLR table and the fourth LLR table as the second LLR table.

16. The control method for a memory system according to claim 15, wherein
if the decoding processing using an LLR calculated from the third or fourth LLR table and the threshold voltage results in an error, the decoding processing is performed using an LLR calculated from the other LLR table and the threshold voltage.

17. The control method for a memory system according to claim 10, wherein
the second LDPC decoding is preferentially used over the first LDPC decoding if the number of times of reading reaches a predetermined number or more.

18. The control method for a memory system according to claim 10, wherein
an upper limit value of the number of iterations of the first LDPC decoding is smaller than an upper limit value of the number of iterations of the second LDPC decoding.

19. A memory system comprising:
a storage apparatus including a plurality of NAND-type semiconductor memory cells, each cell being configured to store N-bit coded data based on $2^N$ (N is a natural number not smaller than 2 but not greater than 7) threshold voltage distributions;
an LLR table storage section configured to store a first LLR table that consists of normal LLR data corresponding to average threshold voltage distributions for many semiconductor memory cells and a second LLR table in which values of two LLRs at each location corresponding to each location in the first LLR table at which a sign is inverted between two adjacent LLRs are both "0"; and
a decoder configured to, when performing LDPC decoding processing through probability-based repeated calculations using an LLR calculated from the first or second LLR table and the threshold voltage, perform the decoding processing using the LLR calculated from the second LLR table adapted for a shift of the threshold voltage distributions and from the threshold voltage if the decoding processing using the LLR calculated from the first LLR table and the threshold voltage results in an error.

* * * * *